(12) United States Patent
Mirpuri

(10) Patent No.: US 11,521,947 B1
(45) Date of Patent: Dec. 6, 2022

(54) SPACE EFFICIENT FLIP CHIP JOINT DESIGN

(71) Applicant: NXP USA, Inc., Austin, TX (US)

(72) Inventor: Kabir Mirpuri, Scottsdale, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 17/376,053

(22) Filed: Jul. 14, 2021

(51) Int. Cl.
 *H01L 21/00* (2006.01)
 *H01L 23/00* (2006.01)
 *H01L 23/528* (2006.01)

(52) U.S. Cl.
 CPC ............ *H01L 24/14* (2013.01); *H01L 23/528* (2013.01); *H01L 2224/48227* (2013.01)

(58) Field of Classification Search
 CPC .................. H01L 24/14; H01L 23/528; H01L 2224/48227
 See application file for complete search history.

(56) References Cited

U.S. PATENT DOCUMENTS

| | | | | |
|---|---|---|---|---|
| 7,344,915 B2* | 3/2008 | Appelt | ............ | H01L 23/49816 438/106 |
| 7,618,848 B2* | 11/2009 | Do | ................ | H01L 23/49548 257/676 |
| 7,635,914 B2* | 12/2009 | Palaniappan | ........ | H01L 25/105 257/737 |
| 7,669,320 B2* | 3/2010 | Hurwitz | ............ | H01L 21/4857 438/42 |
| 7,968,996 B2* | 6/2011 | Do | ................ | H01L 23/3107 257/292 |
| 9,305,877 B1* | 4/2016 | Yu | ................ | H01L 23/3114 |
| 10,254,499 B1* | 4/2019 | Cohen | ............ | B23K 1/20 |
| 2008/0017955 A1* | 1/2008 | Do | ................ | H01L 23/49575 257/659 |
| 2008/0036052 A1* | 2/2008 | Do | ................ | H01L 23/49575 257/E25.023 |
| 2010/0001391 A1* | 1/2010 | Do | ................ | H01L 23/49548 257/692 |
| 2010/0193926 A1* | 8/2010 | Do | ................ | H01L 23/4951 257/676 |
| 2012/0145442 A1* | 6/2012 | Gupta | ............ | H01L 23/528 174/267 |
| 2015/0014850 A1* | 1/2015 | Gupta | ............ | H01L 24/14 257/737 |
| 2021/0107002 A1* | 4/2021 | Gayer | ............ | C12N 15/1093 |

FOREIGN PATENT DOCUMENTS

| | | | | |
|---|---|---|---|---|
| CN | 110199019 A | * | 9/2019 | ........... C12Q 1/6869 |
| DE | 102018122228 A1 | * | 5/2019 | ........ H01L 21/4853 |
| WO | WO-2008010774 A1 | * | 1/2008 | ........ H01L 23/4951 |
| WO | WO-2008154450 A1 | * | 12/2008 | ........... A61F 5/0076 |

* cited by examiner

Primary Examiner — Laura M Menz

(57) ABSTRACT

An apparatus includes an Integrated Circuit (IC). A first pillar includes a first end and a second end. The first end is connected to the IC and the second end includes a first attachment point collinear with a first central axis of the first pillar. The first attachment point includes a first solder volume capacity. A second pillar includes a third end and a fourth end. The third end is connected to the IC and the fourth end includes a second attachment point disposed on a side of the second pillar facing the first pillar. The second attachment point includes a second solder volume capacity being less than the first solder volume capacity. A first distance between the first end and the second end is less than a second distance between the third end and the fourth end.

20 Claims, 7 Drawing Sheets

SPACE EFFICIENT FLIP CHIP JOINT DESIGN

FIELD

This disclosure relates generally to Flip Chip (FC) assembly, and more specifically to improving the density of a flip chip assembly with a combination of signal specific pillars.

BACKGROUND

Integrated circuits with a large number of external connections or "pins" are often limited in their ability to be assembled into small packages with traditional wire bonding techniques. The sizes of these packages are deemed to be pin-limited rather than die-size limited. Accordingly, FC assemblies are often used for high Input/Output (I/O) IC devices. FC assemblies enable a high density of joints (e.g., solder joints), with low pitch distances. System on Chip (SoC) devices integrate additional functionality, thereby increasing the need to provide more I/O on the IC. One approach to increasing package I/O density is to reduce the diameter of a pillar connecting a semiconductor IC to the package substrate, however this approach is to the detriment of signal quality and/or current capacity.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments described herein provide for improvements in pin limited FC package density by using different pillar designs dependent upon electrical signal categories. Pillars having a small cross-sectional area support less solder volume than pillars with a larger cross-sectional area. Throughout this disclosure, references to low solder volume pillars and high solder volume pillars refer to pillars with different cross-sectional areas having correspondingly different capacities to support a volume of solder. In various embodiments, the solder is used in attachment points between the pillars and a substrate, to which the pillars are subsequently attached. High solder volume pillars are used for signals requiring high current density or having high signal frequencies, while low solder volume pillars are used for signals having lower current density or lower signal frequencies. The low solder volume pillars are smaller than the high solder volume pillars, thus improving package density. Specifically, in one embodiment, cylindrical pillars are used for high solder volume connections between the semiconductor and package substrate, while rectangular pillars are used for signals that can tolerate a lower solder volume. One or more rectangular pillars are disposed around a shorter cylindrical pillar. The cylindrical pillar is soldered to a matching assembly substrate through a vertical connection, orthogonal to a surface of the semiconductor, while the one or more rectangular pillars are connected horizontally to the assembly substrate, or parallel to the surface of the semiconductor.

Figure 1:
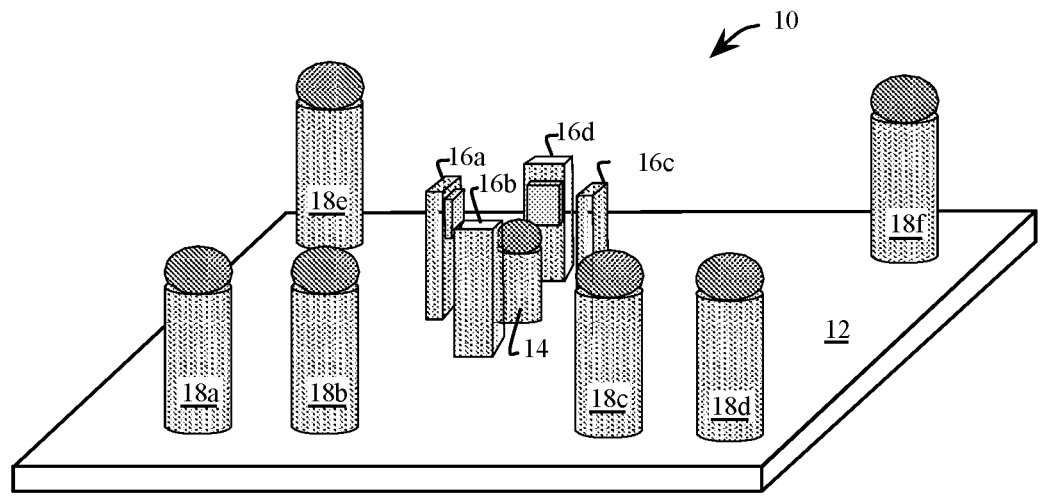
FIG. 1 is a perspective view of an Integrated Circuit (IC), modified for a space efficient flip chip joint design, in accordance with an example embodiment of the present disclosure.

FIG. 1 shows a perspective view of an example embodiment 10 of an IC, modified for a space efficient FC joint design. A substrate 12, such as a printed circuit board, a semiconductor substrate or an IC, is subsequently processed to include a first pillar 14. In one embodiment, the first pillar 14 has a cylindrical shape with a circular cross-sectional end attached to the substrate 12. The example embodiment 10 further includes second pillars 16a, 16b, 16c and 16d (generally 16) surrounding the first pillar 14 and being taller than the first pillar 14. In one example embodiment, the second pillars 16 each have a rectangular shape with a rectangular cross-sectional end attached to the substrate 12. In other embodiments, the number of second pillars 16 surrounding the first pillar 14 is 1, 2, 4, 6 or 8. In another embodiment, the number of second pillars 16 surrounding the first pillar 14 is any even or odd number up to a practical manufacturing limit defined by the cross-sectional areas of the first pillar 14 and the second pillar 16. For example, a larger first pillar 14 will accommodate more second pillars 16. In one embodiment, the second pillars 16 are symmetrically disposed around the first pillar 14. In other example embodiments the first pillar 14 and the second pillars 16 have shapes that differ from cylindrical and rectangular respectively, limited by the ability to efficiently surround the first pillar 14 with the second pillars 16 and to match the pillar structures to a corresponding assembly substrate. Similarly, in one embodiment, the second pillars 16 surrounding a first pillar 14 is a combination of alternative shapes and/or cross-sections.

In the example embodiment 10, the substrate 12 includes the combination of the first pillar 14 and second pillars 16 as well as additional third pillars 18a to 18f (generally 18 or "tall cylindrical pillars"). In example embodiments, the signals generated or received at the substrate 12 are assigned to pillars based on requirements of current density or frequency characteristics (e.g., average or peak frequency components). In one example, a high frequency and/or high current signal will be electrically coupled to either the first pillar 14 or one of the third pillars 18, while a lower frequency and/or lower current density signal will use the more compact—lower solder volume second pillars 16. In one embodiment, the formation of a group of signals defined by a first pillar 14 surrounded by one or more second pillars 16 is replicated uniformly across the substrate 12. In another embodiment, the formation of a group of signals defined by a first pillar 14 surrounded by one or more second pillars 16 is replicated only in areas of the substrate 12 based on signal requirements.

Figure 2:
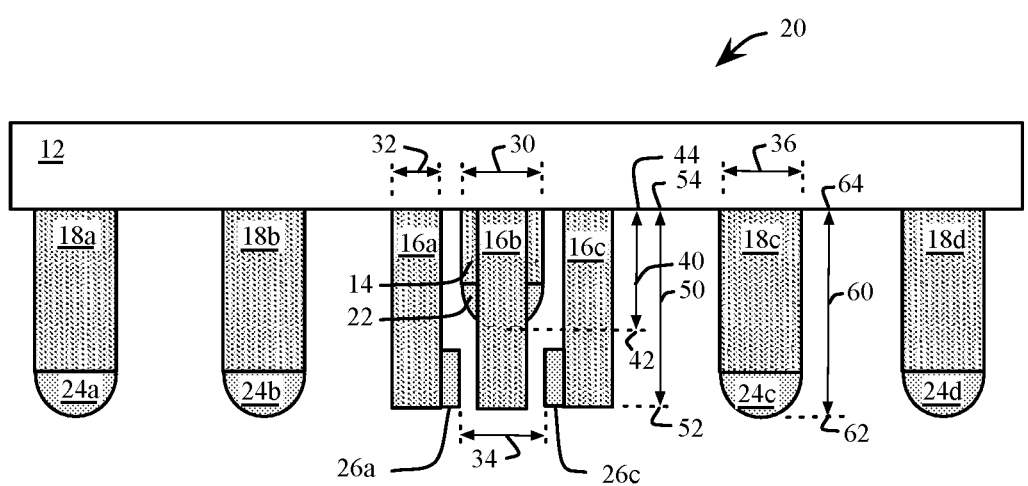
FIG. 2 is a side view of the IC of FIG. 1, in accordance with an example embodiment of the present disclosure.

FIG. 2 shows a side view of an example embodiment 20 similar to the embodiment 10 of FIG. 1. In the embodiment 20, each of the pillars 14, 16 and 18 have "attachment points" formed by solder deposited on the tip of the respective pillar, for example by an electroplating process. Specifically, the first pillar 14 includes an attachment point 22, each of the third pillars 18 include a respective attachment point 24a to 24d (generally 24), and each of the second pillars 16 include a respective attachment point 26a, 26b (not shown), 26c and 26d (not shown), (generally 26). The attachment points 22 and 24 are collinear with a central axis of the respective first pillar 14 and the third pillars 18, and on a respective end of each pillar. Conversely, the attachment points 26 are on a side of the second pillars 16 facing the first pillar 14. In the example embodiment 20, the first pillar 14 has a diameter 30 being greater than the width 32 of each of the second pillars 16. A spacing 34 between a pair of attachment points 26 is wider than the diameter 30 and is also defined by a matching assembly substrate to which to embodiment 20 is subsequently attached. The first pillar 14 has a first length 40 measured between a first end 42 and a second end 44. The second pillars 16 each have a second length 50 measured between a third end 52 and a fourth end 54. The third pillars 18 each have a third length 60 measured between a fifth end 62 and a sixth end 64. In one embodiment, the third length 60 is the same as the second length 50. During the assembly process of attaching the embodiment 20 to a corresponding assembly substrate, small dimensional and shape variations are accommodated by deformation and flowing of the solder tips on respective attachment points.

Figure 3:
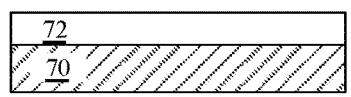
FIG. 3 through FIG. 17 are cross-sectional views of the progressive manufacturing steps a flip chip substrate, in accordance with an example embodiment of the present disclosure.
Figure 8:
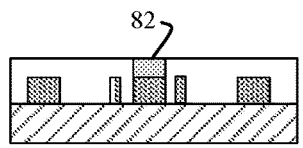
Figure 13:
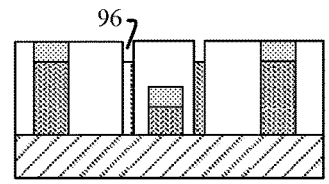
Figure 4:
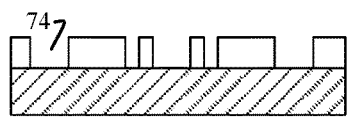
Figure 9:
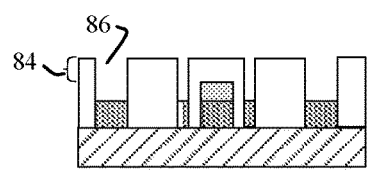
Figure 14:
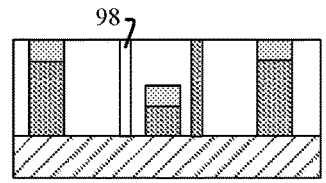
Figure 5:
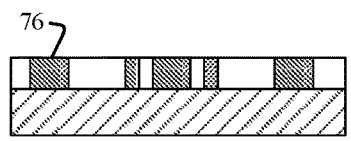
Figure 10:
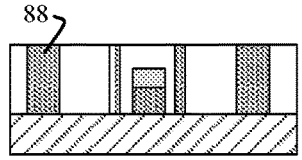
Figure 15:
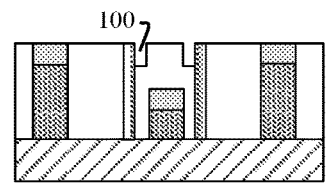
Figure 6:
Figure 11:
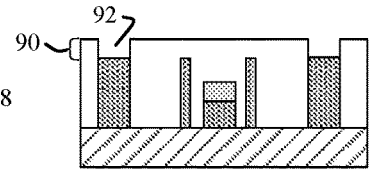
Figure 16:
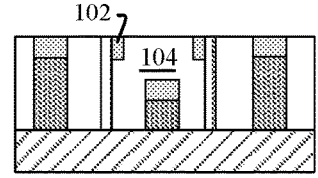
Figure 7:
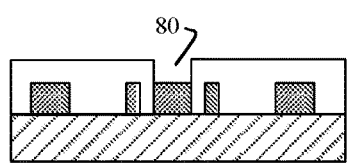
Figure 12:
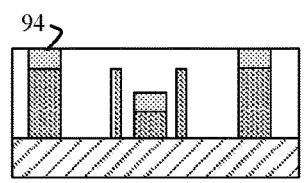
Figure 17:
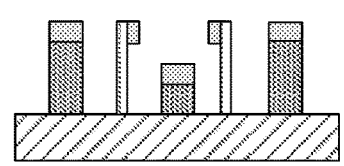

FIG. 3 through FIG. 17, show the progressive manufacturing steps used to form the embodiment 20 of FIG. 2 or similar example embodiments of the present disclosure. In FIG. 3, a substrate 70 includes a photoresist (PR) layer 72 deposited thereon. At FIG. 4, the PR layer 72 is patterned, developed and selectively stripped to form openings 74. At FIG. 5, the openings 74 are filled with a conductive material 76 used to form the pillars 14, 16 and 18 (e.g., Copper). At FIG. 6, an additional PR layer 78 is deposited, spun-on or otherwise applied. At FIG. 7, the PR layer 78 is developed and stripped to form an opening 80. At FIG. 8, an attachment point 82 (e.g., solder) fills the opening 80. At FIG. 9, a PR layer 84 is deposited and subsequently developed and stripped to form openings 86. At FIG. 10, additional conductive material 88 is added to file the openings 86 and thereby increase the height of resulting pillars. At FIG. 11, a PR layer 90 is deposited and subsequently developed and stripped to form openings 92. At FIG. 12, attachment points 94 (e.g., solder) fills the openings 92. At FIG. 13, openings 96 are formed. At FIG. 14, the openings 96 are filled with conductive material 98, thereby increasing a pillar height. At FIG. 15, openings 100 are formed in the PR. At FIG. 16, the openings 100 are filled with solder to form attachment points 102. At FIG. 17, the remaining PR 104 of FIG. 16 is removed, thereby forming a structure similar to the example embodiment 20 of FIG. 2.

Figure 18:
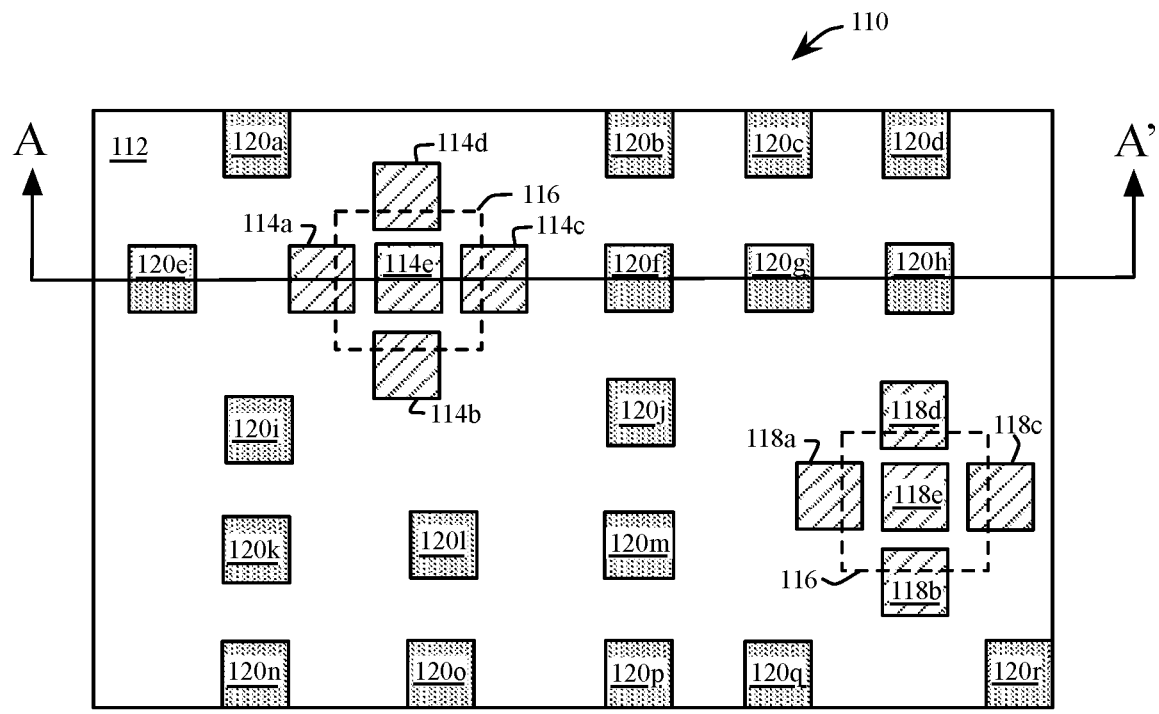
FIG. 18 is a plan view of an example embodiment of an assembly substrate.

FIG. 18 shows an example embodiment 110 of an assembly substrate forming a counterpart to an embodiment of a substrate with pillars, similar to that shown in FIGS. 1-2. The embodiment 110 includes a substrate 112 with substrate pads 114a, 114b, 114c, 114d and 114e (generally 114). With reference to FIG. 1 and FIG. 2, in one embodiment the substrate pads 114 of FIG. 18 are arranged so that a single substrate pad 114e will align with the first pillar 14. The plurality of substrate pads 114a, 114b, 114c and 114d will surround the central substrate pad 114e with a distance defined by the spacing 34 and to align with the second pillars 16. Specifically, an area outside of the region 116 is subsequently modified through milling, drilling or the like, so that the attachment points 26a and 26c contact the remaining portions of the respective substrate pads 114a and 114c, while the attachment point 22 contacts the larger substrate pad 114e. A similar process occurs for the substrate pads 114b and 114d. In alternate embodiments, having 6 or 8 second pillars 16, the shape of the substrate pad 114e is correspondingly a hexagon or octagon so that that attachment points 26 of the second pillars 16 "face" the first pillar 14. As shown in the example embodiment 110, a second cluster of substrate pads 118a to 118e (generally 118) defines a second grouping of substrate pads arranged to receive a group of a first pillar 14 surrounded by second pillars 16. The substrate pads 118 also have the defined region 116 similar to that used for subsequent milling of the substrate pads 114. In addition to the combination of first pillars 14 and second pillars 16, one or more substrate pads 120a to 120r (generally 120) are placed as required on the substrate 112 to align with respective third pillars 18.

Figure 19:
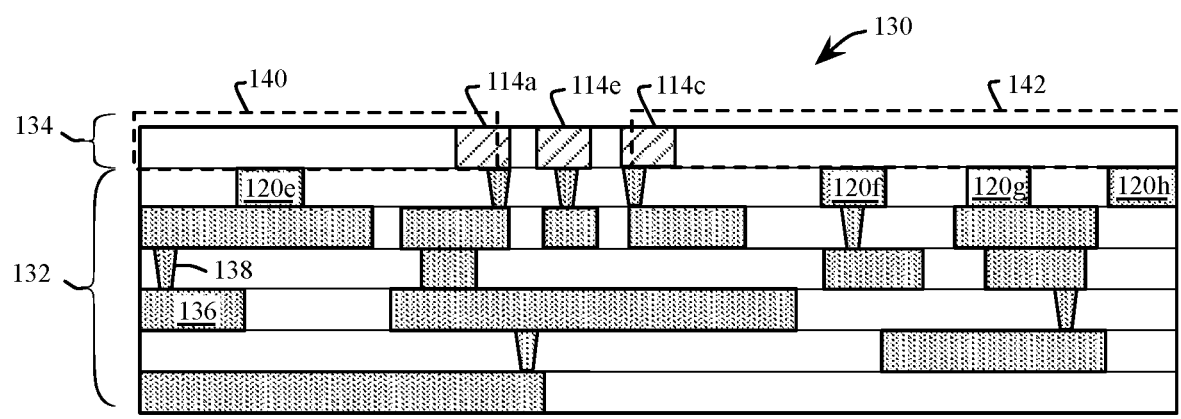
FIG. 19 is a cross-sectional view of the example embodiment of FIG. 18 taken along A-A', further illustrating the assembly substrate.

FIG. 19 shows a cross-sectional view of FIG. 18 taken along A-A'. The example embodiment 130 of FIG. 19 includes a bottom section 132 and a top section 134 of the substrate 112 of FIG. 18. The bottom section 132 includes a plurality of routing layers 136 and vias 138 defining circuit connections. Sections 140 and 142 define areas to be removed from the top section 134 (e.g., the area outside of the region 116 shown in FIG. 18). Removal of sections 140 and 142 is accomplished through a process that selectively removes the conductive material 114 (e.g., Copper) and insulation layers therebetween. Non-limiting examples of a process to remove the sections 140 and 142 include, but are not limited to, drilling, milling and chemical and/or ion etching.

Figure 20:
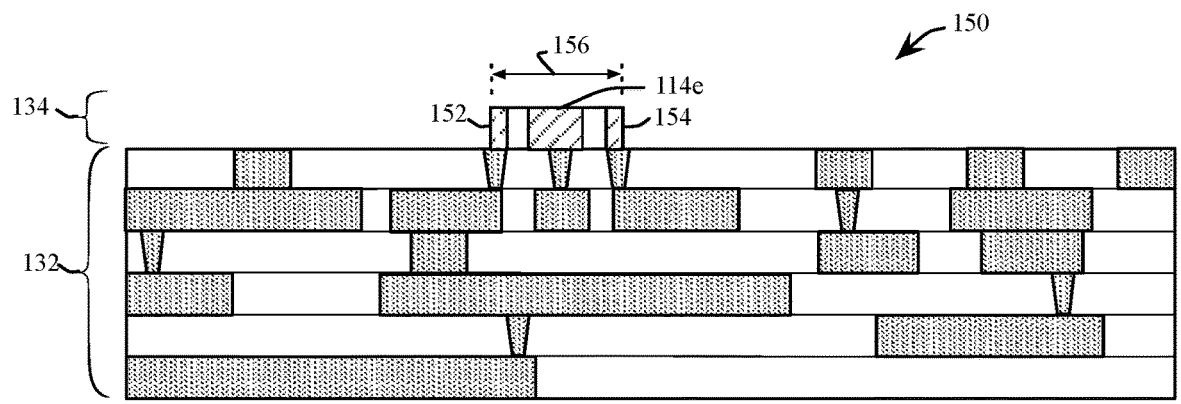
FIG. 20 is a side view of the example embodiment of FIG. 19 after removing a portion of a top layer.
Figure 21:
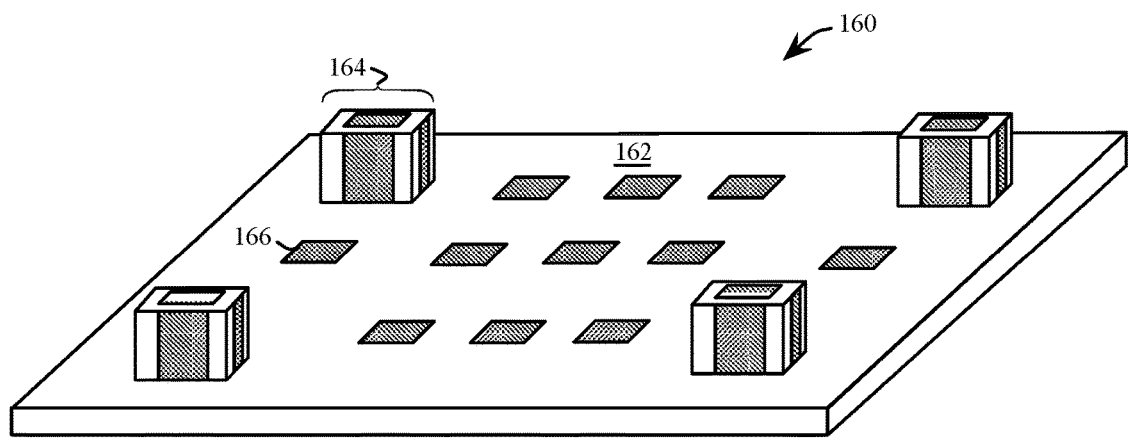
FIG. 21 is a perspective view of the example embodiment of FIG. 20

FIG. 20 shows an example embodiment 150 of a side view of FIG. 19 after removal of the sections 140 and 142. With reference to FIG. 19, the substrate pads 114a and 114c (and similarly 114b and 114d) are modified with portions removed to form modified substrate pads 152 and 154 respectively. The resulting width 156 is designed to be the same as the spacing 34 between the attachment points 26a and 26c, shown in FIG. 2. As previously discussed, minor manufacturing variances between the width 156 (FIG. 20) and the spacing 34 (FIG. 2) are readily accommodated with the conformity of the solder used on the respective attachment points 26a and 26c. FIG. 21 shows a perspective view of an example embodiment 160 after the removal of sections 140 and 142 shown in FIG. 19 and FIG. 20. An assembly substrate 162 includes one or more pad blocks 164 combined with one or more substrate pads 166.

Figure 22:
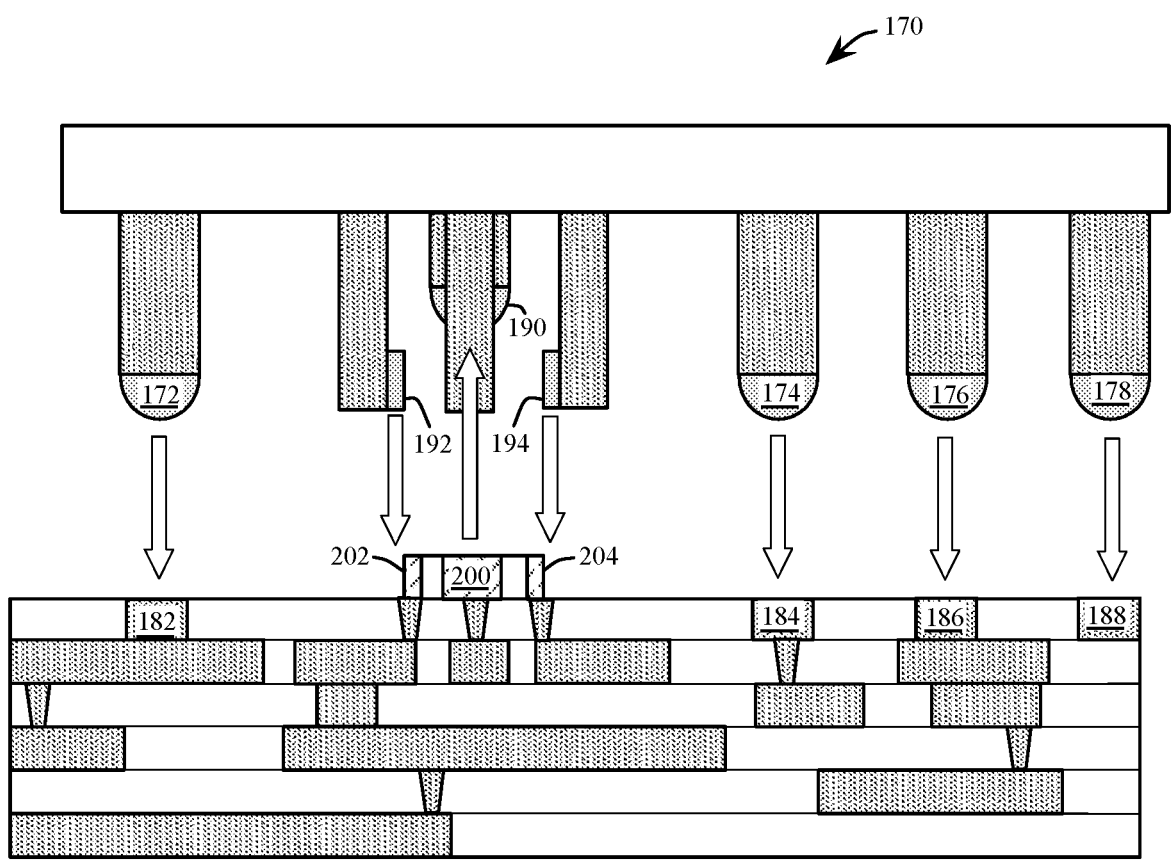
FIG. 22 is an exploded view showing a coupling of the IC of FIG. 2 to the assembly substrate of FIG. 20, in accordance with an example embodiment of the present disclosure.

FIG. 22 is an exploded view of an example embodiment 170 of An IC, (similar to FIG. 2) aligned for attachment to an example embodiment 180 of an assembly substrate, (similar to FIG. 20). Specifically, attachment points 172, 174, 176 and 178 of respective third pillars are aligned to attach to the top of respective substrate pads 182, 184, 186 and 188. The attachment point 190 of a first pillar is aligned to attach to the top of a substrate pad 200. Attachment points 192 and 194 of respective second pillars are aligned to attach to the sides of respective substrate pads 202 and 204. In example embodiments, prior to attaching the substrate and assembly substrate, shown by embodiments 170 and 180 respectively, the solder included in each attachment point 172, 174, 176, 178, 190, 192 and 194 is coated with flux. In various embodiments, the flux is added to the solder by spraying, pin transfer or a combination of spraying and pin transfer.

Figure 23:
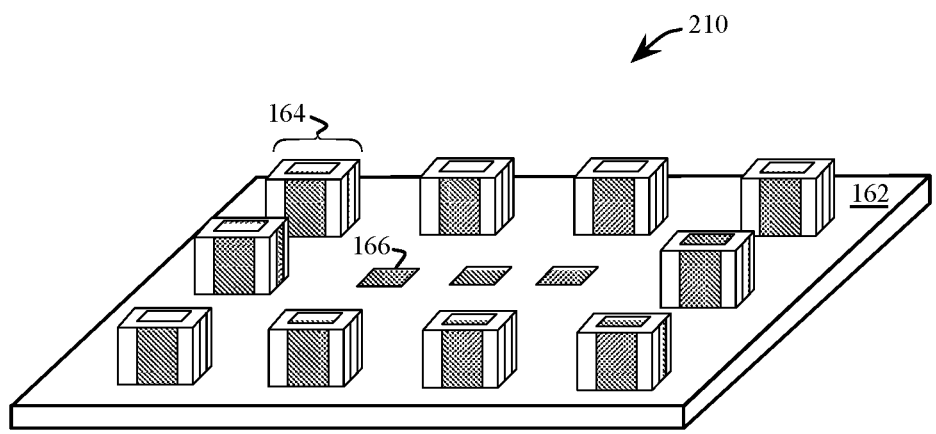
FIG. 23 through 26 are example embodiments of assembly substrates prepared for space efficient flip chip assembly.
Figure 24:
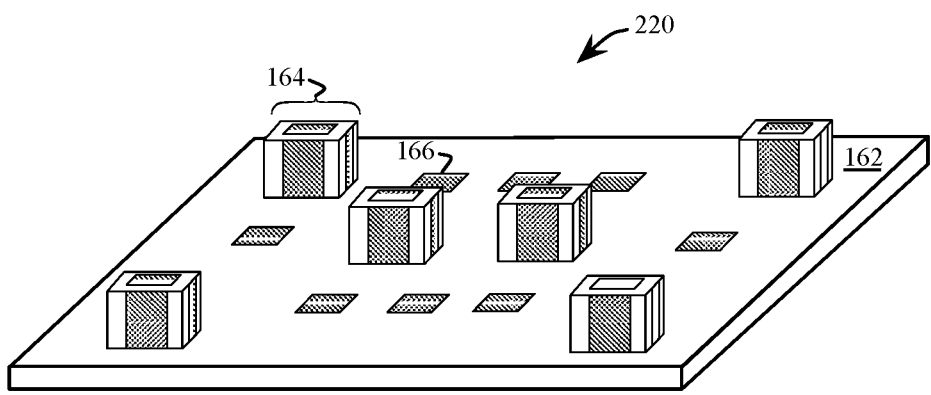
Figure 25:
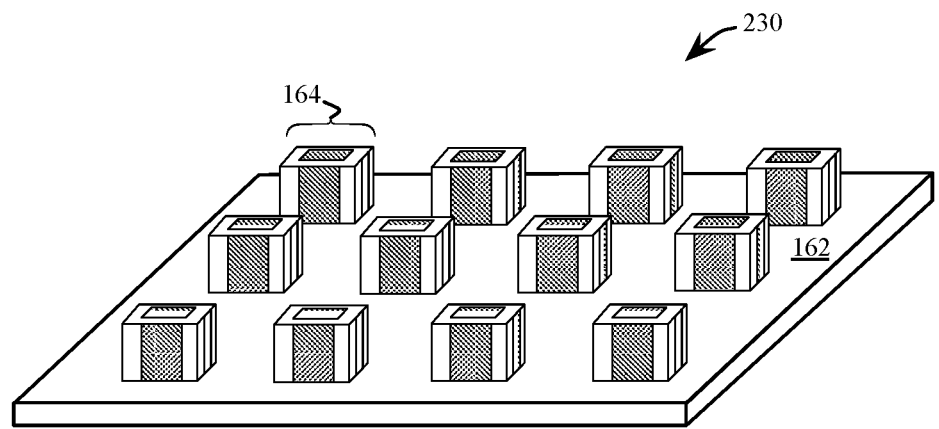
Figure 26:
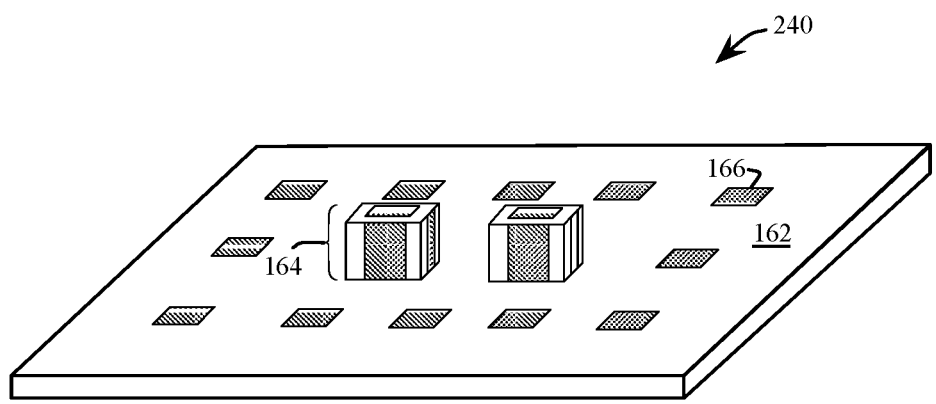

FIG. 23 to FIG. 26 show alternate embodiments to the example embodiment shown in FIG. 21, where pad blocks 164 are placed at any desired location on the assembly substrate 162 in combination with substrate pads 166. Specifically, FIG. 23 shows an example embodiment 210 of pad blocks 164 placed only at the periphery of the assembly substrate 162. FIG. 24 shows an example embodiment 220 of pad blocks 164 placed selectively at the periphery and at the core of the assembly substrate 162. FIG. 25 shows an example embodiment 230 of pad blocks 164 placed uniformly across the assembly substrate 162, with no substrate pads 166 present. FIG. 26 shows an example embodiment 240 of pad blocks 164 placed only at the core of the assembly substrate 162.

As will be appreciated, embodiments as disclosed include at least the following. In one embodiment, an apparatus comprises an Integrated Circuit (IC). A first pillar comprises a first end and a second end. The first end is connected to the IC and the second end comprises a first attachment point collinear with a first central axis of the first pillar. The first attachment point comprises a first solder volume capacity. A second pillar comprises a third end and a fourth end. The third end is connected to the IC and the fourth end and comprises a second attachment point disposed on a side of the second pillar facing the first pillar, wherein the second attachment point comprises a second solder volume capacity being less than the first solder volume capacity. A first distance between the first end and the second end is less than a second distance between the third end and the fourth end.

Alternative embodiments of the apparatus include one of the following features, or any combination thereof. The second pillar is one of a plurality of pillars, each disposed to surround the first pillar and comprising a respective attachment point facing the first pillar. Each of the plurality of pillars are symmetrically disposed to surround the first pillar. The first pillar comprises a cylindrical shape. The second pillar comprises a rectangular shape. A first cross-sectional area of the first pillar is greater than a second cross-sectional area of the second pillar. The first attachment point is connected to a top facet of a pad block of an assembly substrate, the top facet parallel to the assembly substrate, and the second attachment point is connected to a side facet of the pad block, the side facet orthogonal to the top facet. The IC and the assembly substrate are encapsulated.

In another embodiment, an apparatus comprises a semiconductor substrate. A first pillar comprises a first end and a second end. The first end is connected to the semiconductor substrate and the second end comprises a first attachment point collinear with a first central axis of the first pillar. The first attachment point comprises a first solder volume capacity. A second pillar comprises a third end and a fourth end. The third end is connected to the semiconductor substrate and the fourth end comprises a second attachment point disposed on a side of the second pillar facing the first pillar, wherein the second attachment point comprises a second solder volume capacity being less than the first solder volume capacity. A first distance between the first end and the second end is less than a second distance between the third end and the fourth end. An assembly substrate comprises a top facet and a side facet of a pad block, wherein the top facet is orthogonal to the side facet, the first attachment point is connected to the top facet and the second attachment point is connected to the side facet.

Alternative embodiments of the apparatus include one of the following features, or any combination thereof. The second pillar is one of a plurality of pillars, each disposed to symmetrically surround the first pillar and comprising a respective attachment point facing the first pillar. The first pillar comprises a cylindrical shape. The second pillar comprises a rectangular shape. A first cross-sectional area of the first pillar is greater than a second cross-sectional area of the second pillar. The semiconductor substrate and the assembly substrate are encapsulated.

In another embodiment, an apparatus comprises a first substrate comprising a plurality of signal conductors. A cylindrical pillar comprises a first end and a second end. The first end is connected to the first substrate and the second end comprises a first attachment point collinear with a first central axis of the cylindrical pillar. The first attachment point comprises a first solder volume capacity. A first one of a plurality of rectangular pillars is symmetrically disposed around the cylindrical pillar, the first rectangular pillar comprising a third end and a fourth end. The third end is connected to the first substrate and the fourth end comprises a second attachment point disposed on a side of the first rectangular pillar facing the cylindrical pillar, wherein the second attachment point comprises a second solder volume capacity being less than the first solder volume capacity. A first distance between the first end and the second end is less than a second distance between the third end and the fourth end. A second substrate comprises a top facet and a side facet of a pad block, wherein the top facet is orthogonal to the side facet, the first attachment point is connected to the top facet and the second attachment point is connected to the side facet.

Alternative embodiments of the apparatus include one of the following features, or any combination thereof. One of the signal conductors comprising a high current density is electrically coupled to the cylindrical pillar and another one of the signal conductors comprising a low current density, lower than the high current density, is electrically coupled to one of the rectangular pillars. A first cross-sectional area of the cylindrical pillar is greater than a second cross-sectional area of the first rectangular pillar. The plurality of rectangular pillars comprises one of four, six or eight pillars. The first substrate further comprises a tall cylindrical pillar comprising a fifth end, a sixth end and the second distance therebetween. The first substrate comprises a plurality of the cylindrical pillars and a plurality of the tall cylindrical pillars.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:
1. An apparatus comprising:
   an Integrated Circuit (IC);

a first pillar comprising a first end and a second end, the first end connected to the IC and the second end comprising a first attachment point collinear with a first central axis of the first pillar, wherein the first attachment point comprises a first solder volume capacity; and a second pillar comprising a third end and a fourth end, the third end connected to the IC and the fourth end comprising a second attachment point disposed on a side of the second pillar facing the first pillar, wherein the second attachment point comprises a second solder volume capacity being less than the first solder volume capacity, and a first distance between the first end and the second end is less than a second distance between the third end and the fourth end.

2. The apparatus of claim 1 wherein the second pillar is one of a plurality of pillars, each disposed to surround the first pillar and comprising a respective attachment point facing the first pillar.

3. The apparatus of claim 2 wherein each of the plurality of pillars are symmetrically disposed to surround the first pillar.

4. The apparatus of claim 1 wherein the first pillar comprises a cylindrical shape.

5. The apparatus of claim 1 wherein the second pillar comprises a rectangular shape.

6. The apparatus of claim 1 wherein a first cross-sectional area of the first pillar is greater than a second cross-sectional area of the second pillar.

7. The apparatus of claim 1 further comprising connecting the first attachment point to a top facet of a pad block of an assembly substrate, the top facet parallel to the assembly substrate, and connecting the second attachment point to a side facet of the pad block, the side facet orthogonal to the top facet.

8. The apparatus of claim 7 wherein the IC and the assembly substrate are encapsulated.

9. An apparatus comprising:
a semiconductor substrate;
a first pillar comprising a first end and a second end, the first end connected to the semiconductor substrate and the second end comprising a first attachment point collinear with a first central axis of the first pillar, wherein the first attachment point comprises a first solder volume capacity;
a second pillar comprising a third end and a fourth end, the third end connected to the semiconductor substrate and the fourth end comprising a second attachment point disposed on a side of the second pillar facing the first pillar, wherein the second attachment point comprises a second solder volume capacity being less than the first solder volume capacity, and a first distance between the first end and the second end is less than a second distance between the third end and the fourth end; and
an assembly substrate comprising a top facet and a side facet of a pad block, wherein the top facet is orthogonal to the side facet, the first attachment point connected to the top facet and the second attachment point connected to the side facet.

10. The apparatus of claim 9 wherein the second pillar is one of a plurality of pillars, each disposed to symmetrically surround the first pillar and comprising a respective attachment point facing the first pillar.

11. The apparatus of claim 9 wherein the first pillar comprises a cylindrical shape.

12. The apparatus of claim 9 wherein the second pillar comprises a rectangular shape.

13. The apparatus of claim 9 wherein a first cross-sectional area of the first pillar is greater than a second cross-sectional area of the second pillar.

14. The apparatus of claim 9 wherein the semiconductor substrate and the assembly substrate are encapsulated.

15. An apparatus comprising:
a first substrate comprising a plurality of signal conductors;
a cylindrical pillar comprising a first end and a second end, the first end connected to the first substrate and the second end comprising a first attachment point collinear with a first central axis of the cylindrical pillar, wherein the first attachment point comprises a first solder volume capacity;
a first one of a plurality of rectangular pillars symmetrically disposed around the cylindrical pillar, the first rectangular pillar comprising a third end and a fourth end, the third end connected to the first substrate and the fourth end comprising a second attachment point disposed on a side of the first rectangular pillar facing the cylindrical pillar, wherein the second attachment point comprises a second solder volume capacity being less than the first solder volume capacity, and a first distance between the first end and the second end is less than a second distance between the third end and the fourth end; and
a second substrate comprising a top facet and a side facet of a pad block, wherein the top facet is orthogonal to the side facet, the first attachment point connected to the top facet and the second attachment point connected to the side facet.

16. The apparatus of claim 15 wherein one of the signal conductors comprising a high current density is electrically coupled to the cylindrical pillar and another one of the signal conductors comprising a low current density, lower than the high current density, is electrically coupled to one of the rectangular pillars.

17. The apparatus of claim 15 wherein a first cross-sectional area of the cylindrical pillar is greater than a second cross-sectional area of the first rectangular pillar.

18. The apparatus of claim 15 wherein the plurality of rectangular pillars comprises one of four, six or eight pillars.

19. The apparatus of claim 15 wherein the first substrate further comprises a tall cylindrical pillar comprising a fifth end, a sixth end and the second distance therebetween.

20. The apparatus of claim 19 wherein the first substrate comprises a plurality of the cylindrical pillars and a plurality of the tall cylindrical pillars.

* * * * *